(12) United States Patent
Barnett et al.

(10) Patent No.: US 6,600,659 B1
(45) Date of Patent: Jul. 29, 2003

(54) ELECTRONIC STACKED ASSEMBLY

(75) Inventors: Ron Barnett, Santa Rosa, CA (US); Charles Joseph Buondelmonte, Yardley, PA (US); Ilya Alexander Korisch, Somerset, NJ (US); Louis Thomas Manzione, Summit, NJ (US); Richard F Schwartz, Cranbury, NJ (US); Thaddeus Wojcik, Hopewell, NJ (US); Hui Wu, Union, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/521,935

(22) Filed: Mar. 9, 2000

(51) Int. Cl.$^7$ ................................................. H05K 7/02
(52) U.S. Cl. ...................... 361/761; 361/790; 361/735
(58) Field of Search ................................ 361/761–763, 361/767, 784, 790, 799, 728, 729, 730, 733, 735

(56) References Cited

U.S. PATENT DOCUMENTS

| | | | | |
|---|---|---|---|---|
| 3,777,221 A | * | 12/1973 | Tatusko et al. | 317/101 |
| 4,133,592 A | * | 1/1979 | Cobaugh et al. | 339/17 |
| 4,339,628 A | | 7/1982 | Marcantonio et al. | 174/35 |
| 4,658,334 A | * | 4/1987 | McSparran et al. | 361/415 |
| 5,128,831 A | * | 7/1992 | Fox, III et al. | 361/396 |
| 5,335,144 A | * | 8/1994 | Maroushek | 361/695 |
| 5,874,920 A | | 2/1999 | Aracki et al. | 343/702 |
| 5,959,830 A | * | 9/1999 | Inagawa et al. | 361/502 |
| 6,005,764 A | * | 12/1999 | Anderson et al. | 361/500 |
| 6,195,268 B1 | * | 2/2001 | Eide | 361/803 |
| 6,201,698 B1 | * | 3/2001 | Hunter | 361/704 |
| 6,239,359 B1 | * | 5/2001 | Lilienthal et al. | 174/35 |
| 6,286,212 B1 | * | 9/2001 | Eaton | 165/185 |

FOREIGN PATENT DOCUMENTS

| | | | | |
|---|---|---|---|---|
| DE | 2148568 | 4/1973 | | H05K/9/00 |
| EP | 0844813 | 5/1998 | | H05K/9/00 |
| JP | 06039461 | 2/1994 | | H05K/9/00 |

* cited by examiner

*Primary Examiner*—David Martin
*Assistant Examiner*—Thanh S. Phan
(74) *Attorney, Agent, or Firm*—David Volejnicek

(57) ABSTRACT

A new physical design for electronic devices (100) comprises a multi-layer stacked assembly (104–110) of a plurality of pan-shaped conductive units that form the layers of the assembly. Each unit is preferably formed from a single sheet of metal into which electronic components, such as an antenna array (208) or a filter array (314) of a transceiver, have been stamped, cut, or etched, and which is then bent around its periphery to form a pan shape. The pans are oriented to face the same direction, are stacked one on top of another, and are fixedly attached to each other by weld, solder, or adhesive. The electrical components defined by the different units are electrically interconnected in a connectorless manner, preferably by flanges (122, 124) formed in the same sheets of metal as the units themselves and extending between the units. Adjacent units in the stack define electromagnetically isolated chambers, e.g., for the filter array. Some layers perform double duty, e.g., a layer (106) that forms a part of the chamber that houses the filter array also acts as a reflector plane for the antenna array.

29 Claims, 6 Drawing Sheets

ELECTRONIC STACKED ASSEMBLY

TECHNICAL FIELD

This invention relates to the structure and manufacturing of electronic devices.

BACKGROUND OF THE INVENTION

Transceiver technology has evolved over the decades from the use of wires, electro-mechanical, components, and machined waveguide structures to the use of coax and thick film/thin film microstrip/stripline-based circuitry. But even with this evolution, the recent proliferation of, and resulting stiff competition among, wireless communications products have led to price/performance demands on transceivers that conventional technologies find difficult to meet. A transceiver conventionally comprises a protective enclosure, an antenna, "front end" filters (e.g., a duplexer), amplifiers and other transceiver circuitry, and connectors and cabling. The most expensive components typically are the antenna, the filters, and the amplifiers.

Conventional antenna and filter manufacturing techniques use a variety of precision-machined components, which are manually or automatically assembled and aligned and then assembled onto printed-circuit boards. High-volume manufacturing techniques have been used to reduce the costs of some conventional antennas and filters. However, these techniques do nothing to improve the performance of these components, nor do they improve the costs of low- and medium-volume components. Moreover, they do nothing to reduce the amount and the cost of cabling and connectors between the antenna and the filters; these components not only add to the cost of the transceiver, but also reduce the overall performance thereof. Others have sought to reduce the cost of antennas and filters at the expense of other parts of the transceiver; essentially, by shifting the cost to these other parts. One example is replacing standard front-end components with ones that have a better performance to make up for the poor performance of cheap antennas and filters, such as replacing the low-noise pre-amplifier (LNA) with one that has a lower noise figure and a higher dynamic range (i.e., higher 1-dB compression or higher third-order intercept (TOI)), or replacing the output power amplifier (PA) with one that has a higher output power. The problem with these approaches is that they merely transfer the cost to another area of the transceiver without substantially lowering the cost of the transceiver as a whole. In fact, they generally increase the complexity and the cost of the transceiver.

The problems faced by transceiver technology illustrate the problems being faced by the electronics industry as a whole: the downward pressure on prices, and hence costs, of electronic devices accompanied by rising expectations for their performance. What the art as a whole seeks are simpler and cheaper manufacturing techniques for electronic devices that also improve, or at least do not degrade, the devices' performance.

SUMMARY OF THE INVENTION

This invention is directed to solving these and other problems, disadvantages, and needs of the prior art. Generally according to the invention, a new physical design is provided for electronic devices. The design is particularly advantageous for radio frequency (RF) devices, such as radios, that include circuit components which may require electromagnetic shielding. Generally, the design is a stacked assembly made of a plurality of conductive portions. Some are planar, each defining a plane. Others are wall portions, each defining a closed wall within a plane. The planar portions and the wall portions are positioned side-by-side with each other along an axis, with their planes being substantially perpendicular to the axis. The planar portions and the wall portions alternate with each other, and are affixed to each other. Each portion may be a distinct unit, or a planar portion and a wall portion may form a single unit, e.g., one formed from a single sheet of conductive material. At least some of the portions carry electrical components all of which are interconnected with each other. At least some of the portions form at least one electromagnetically isolated chamber that encloses at least some of the electrical components. Illustratively, the design is a multi-layer, stacked assembly of a plurality of pan-shaped conductive units or layers, at least some of which carry electrical components. All of the units are oriented (face) in the same direction, are stacked one on top of another, and are fixedly attached to each other, e.g., by weld, solder, adhesive, or mechanical attachment such as rivets, screws, bent tabs, or twisted tabs. Adjacent units advantageously define electromagnetically isolated chambers. The electrical components carried by the different units are electrically connected to each other.

The stacked assembly is easy to assemble: At least some of the plurality of conductive planar portions and the plurality of conductive wall portions are caused to carry electrical components, the portions are arranged alternating with each other and positioned side-by-side with each other along an axis with their planes being substantially perpendicular to the axis, and the portions are affixed to each other so that all of the electrical components are interconnected with each other and at least some of the portions form at least one electromagnetically isolated chamber that encloses at least some of the electrical components. In the illustration embodiment, the electrical components are defined by, e.g., mounted on or formed in, at least some of the units, the units are stacked one on top of each other such that they all face in the same direction and are attached to each other, and the electrical components carried by different units are electrically connected to each other. Preferably each unit is made of a single unitary member (e.g., a metal sheet) that is shaped (e.g., bent, or folded) to create the pan shape. Alternatively, each unit is made in two parts: a planar member (e.g., a flat sheet) that forms the bottom of the pan shape and a closed wall member that forms the sides of the pan shape, and the two parts are then fused together. Preferably, low-cost manufacturing techniques, such as metal stamping, cutting, and/or etching, are used to form the electrical components, (e.g., antennas, filters) in the units. Preferably, the stacked units are attached to each other via low-cost fusing techniques such as soldering, welding, or adhering with adhesive. Significantly, adequate performance and shielding can be achieved with the use of non-conductive (structural) epoxy, which is fast and cheap. Further preferably, interconnection between the electrical components defined by different units are made by flanges that are defined by the units and that extend between the units, or even by edges of the wall members, if there is no lip.

In an illustrative example described further below, the stacked assembly is used to implement a transceiver. The transceiver is constructed as a stacked assembly of its constituent parts, with some parts performing "double duty" in the assembly, thereby decreasing the transceiver's complexity and cost. For example, the antenna and "frontend" filters of the transceiver are integrated into the assembly in such a way that a unit that forms shielding of the filter also forms a ground plane of the antenna, thereby decreasing transceiver complexity and cost. The circuit board that carries the transceiver circuitry is also integrated into the structure such that a unit that forms the shielding of the filter also forms both a mount for the circuit board and a shield for the circuitry.

Benefits that may be obtained through the invention include lower-cost, and higher-performance devices than are obtained through conventional designs, fewer parts and fewer process steps involved in fabrication than are obtained with conventional designs, easier assembly of the device, and elimination of discrete connectors and cabling between layers.

These and other features and advantages of the invention will become more apparent from the following description of an illustrative embodiment of the invention considered together with the drawing.

DETAILED DESCRIPTION

Figure 1:
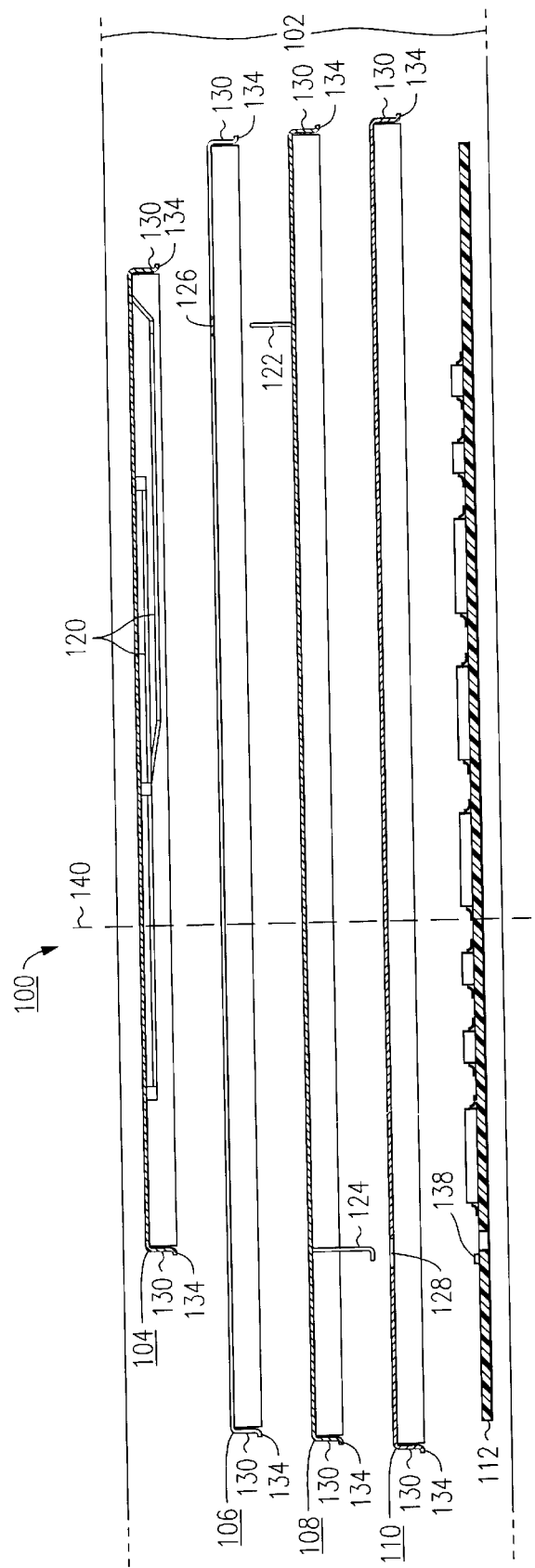
FIG. 1 is an exploded side: view of a transceiver stack assembly that includes an illustrative embodiment of the invention.
Figure 6:
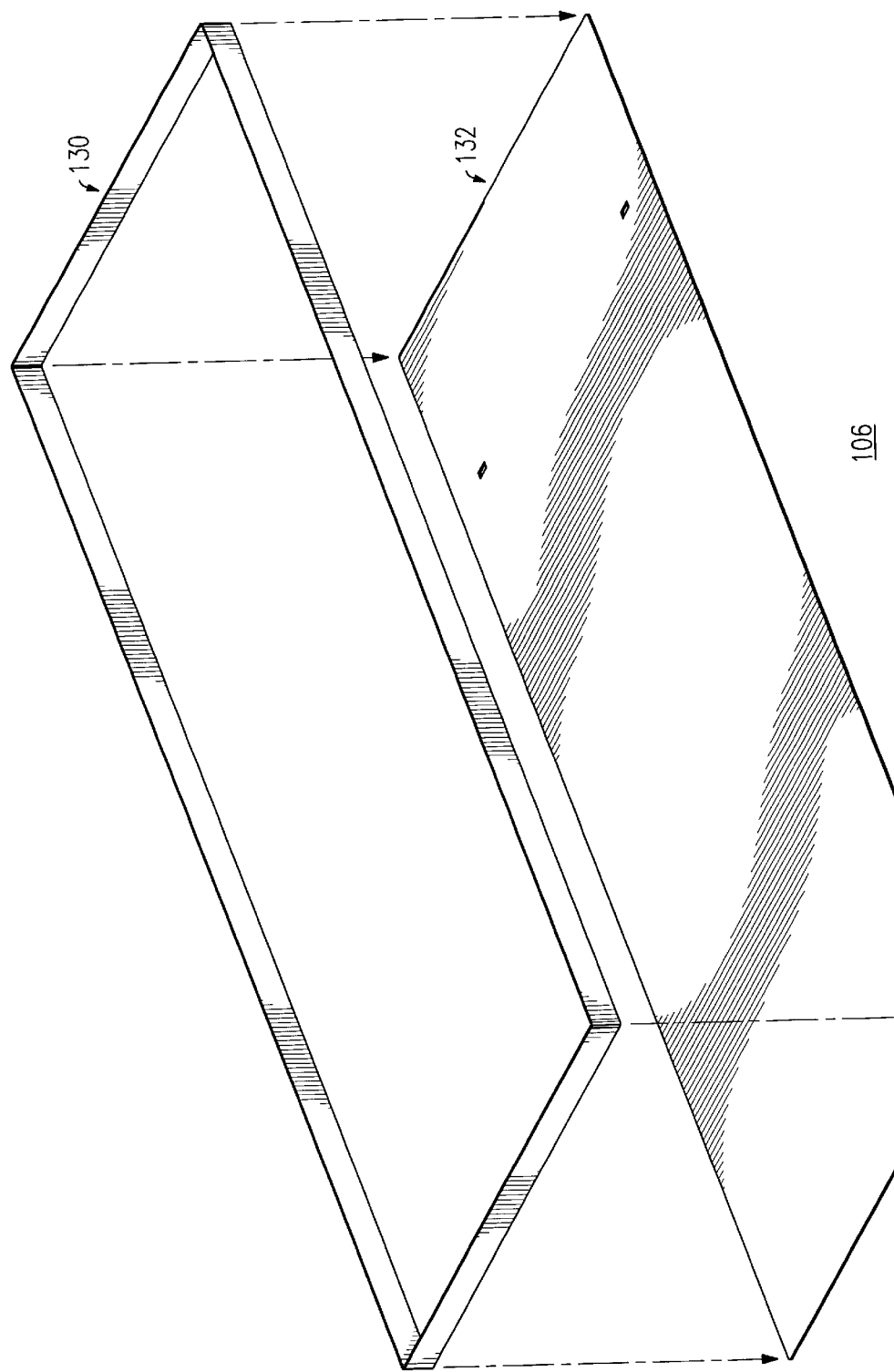
FIG. 6 is an exploded perspective view of an alternative embodiment of a layer of the transceiver stack assembly of FIG. 1.

FIG. 1 shows an exploded front view of a stack assembly 104–112 of a transceiver 100. Transceiver 100 may be any desired device, e.g., a wireless communications system base station or user terminal. While transceiver 100 is used as an example herein, the invention may be employed in any electronic stack assembly. Stack assembly 104–112 may be mounted inside an electromagnetically permeable protective enclosure 102, e.g., a plastic case, as is conventional, and comprises a plurality of units, or layers 104–112, that are oriented to all face in the same direction and are stacked one on top of another along an axis 140 and are attached together, e.g., by soldering, welding, or mechanical attachment such as riveting or adhering with adhesive (e.g., epoxying, with conductive or nonconductive epoxy). The layers are: an antenna layer 104, which includes the antenna distribution network and combiner 120; an upper reflector layer 106 that acts as a ground plane for the antenna of layer 104; a filter layer 108 that comprises "front-end" filters (a duplexer); a lower reflector layer 110 that together with upper reflector layer 106 acts as an electromagnetically shielding housing for filter layer 108; and an electronics layer 112 that contains the electronics of transceiver 100 (also referred to as the radio layer) that is mounted on and shielded by lower reflector layer 110. Alternatively, electronics layer 112 may be mounted remotely from filter/antenna stack assembly 104–110, and layer 110 may be just a flat sheet of conductive material. Reuse of elements for multiple purposes, such as the use of layer 106 for both antenna reflection and filter shielding, simplifies the design and makes it less costly to implement. Filter layer 108 includes flanges (or bent tabs) 122 by means of which it connects, through orifices 126 in upper reflector layer 106, to distribution network and combiner 120 of antenna layer 104, and further includes flanges 124 by means of which it connects, through orifices 128 in lower reflector layer 110, to electronics layer 112. Flanges 122 and 124 may provide radiative (connectorless) interconnects to duplexer layer 108, or they may provide conductive interconnection by being directly attached, as by solder, to layers 106 and 110. Not shown in the drawings is a central isolation wall which may be required between the two halves of filter layer 108. Each layer 104–110 is preferably stamped or otherwise cut and folded from a single unitary sheet of electrically conductive material, e.g., a plate of metal, to form a pan-shaped unit. Alternatively, side walls 130 of each layer 104–110 may be made separately from the flat-sheet portion 132 of each layer (see FIG. 6), e.g., by stamping, molding, or extrusion. Portion 132 forms a plane, and side walls 130 form a closed wall within a plane that is parallel to the plane of portion 132. Portions 132 and side walls 130 are stacked along axis 140 which is perpendicular to their planes and are attached to each other by soldering, welding, or adhering in order to form the pan-shaped unit. Layer 106 that is made in this manner is shown in FIG. 6. The height of side walls 130 may be varied from layer to layer as needed to provide clearance for electronic components, optimum performance, or shielding. Optionally, side walls 130 of each layer 104–110 may include lips 134, shown in FIG. 1, which facilitate the attaching of layers 104–110 to each other. Moreover, due to the peculiarities of the metal-stamping process, the double ("Z"-shaped) bend yields greater precision in the spacing of adjacent layers than would a single bend. As noted previously, layer 110 may just be a flat sheet of conductive material. Layer 112 is illustratively a conventional printed circuit board with electronic components mounted thereon. Stack assembly 104–112 and its component layers are well suited for use with automated (robotic) manufacturing and assembly techniques.

Figure 2:
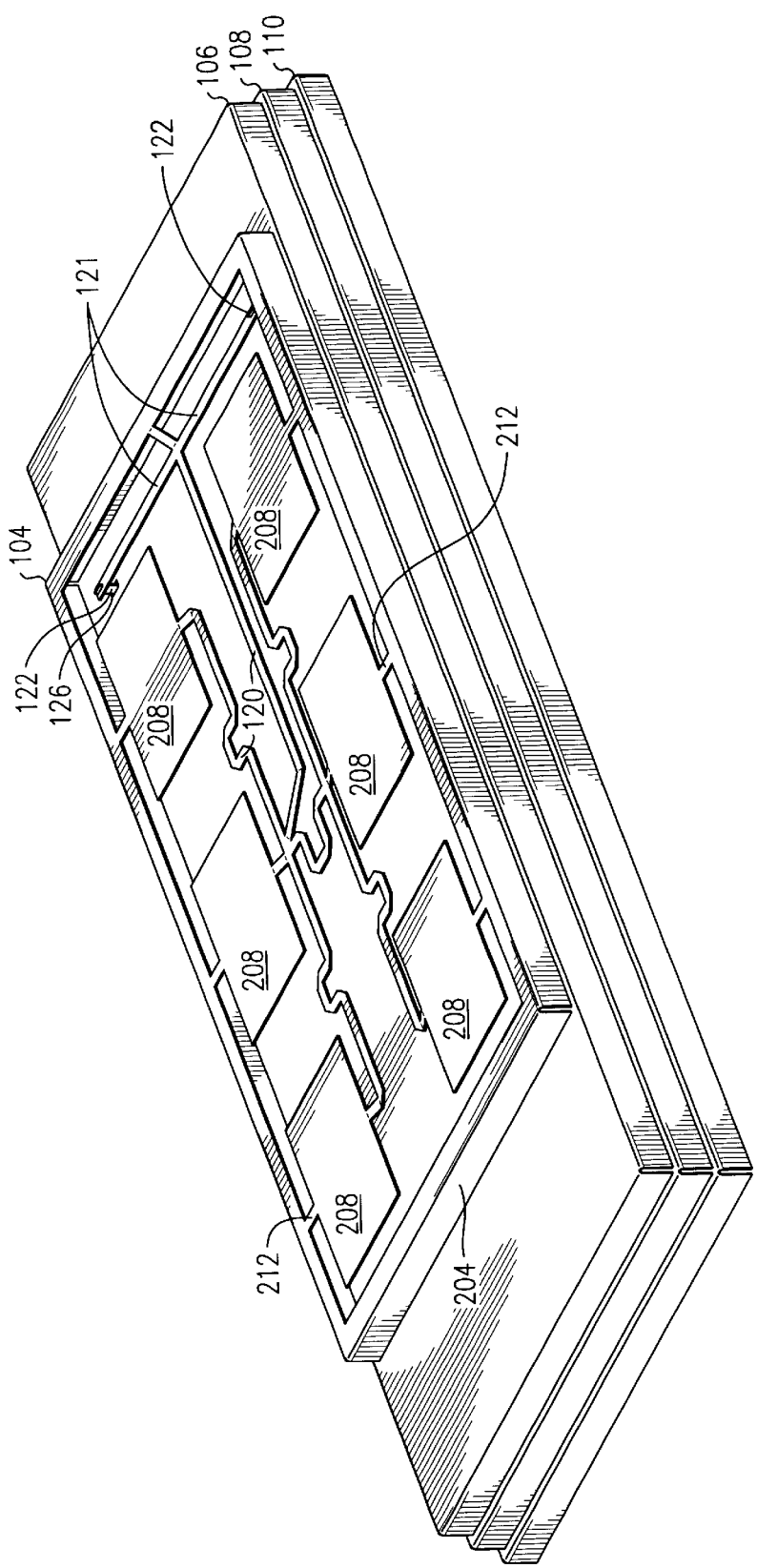
FIG. 2 is a perspective view of the transceiver stack assembly of FIG. 1 and its antenna layer.

FIG. 2 shows a perspective view of stack assembly 104–112 (without flanges 134) of FIG. 1, and shows details of antenna layer 104. Antenna layer 104 comprises a frame 204 and a patch array inside of frame 204. Patch array comprises a plurality of radiative elements 208 each connected to frame 204 by a support 212 and interconnected in parallel by a distribution network and combiner 120. The length of supports 212 is preferably one-quarter wavelength of the main operating frequency of transceiver 100, so as not to perturb the electrical performance of radiative element 208. Advantageously, distribution network and combiner 120 includes a "T"-shaped combiner 121, which in conventional architectures forms a part of the duplexer (layer 108). Because the antenna and the duplexer are integrated herein into a single structure, combiner 121—or any other element, for that matter—may be placed at any layer where it best fits in, i.e., where there is room for it. Frame 204 and the array of radiative elements 208 are preferably of unitary construction, cut, stamped, etched, or otherwise produced from a single sheet of metal. Antenna layer 104 is illustratively the antenna disclosed in the application of R. Barnett et al. entitled "Sheet-Metal Antenna", Ser. No. 09,521,727, filed on even date herewith and assigned to the same assignee.

Flanges 122 of filter layer 108 are coupled to combiner 121 of feed network 120 of the patch array. The coupling may be either conductive, e.g., a solder joint, or capacitive. Frame 204 spaces the patch array away from the antenna ground plane formed by upper reflector layer 106. Air between the ground plane and the patch array forms the dielectric layer of the antenna. Distribution network and combiner 120 preferably lie closer to the antenna ground plane than radiative elements 208. This creates a vertical spacing between radiative elements 208 and network 120 and so lessens the requirement for a horizontal spacing between them while maintaining the net spacing between them. Frame 204 is welded, epoxied, soldered, or otherwise attached to upper reflector layer 106. Upper reflector layer 106 is similarly attached to filter layer 108. Upper reflector layer 106 is preferably merely a metal "pan" with orifices 126 for flanges 122 of filter layer 108.

Figure 3:
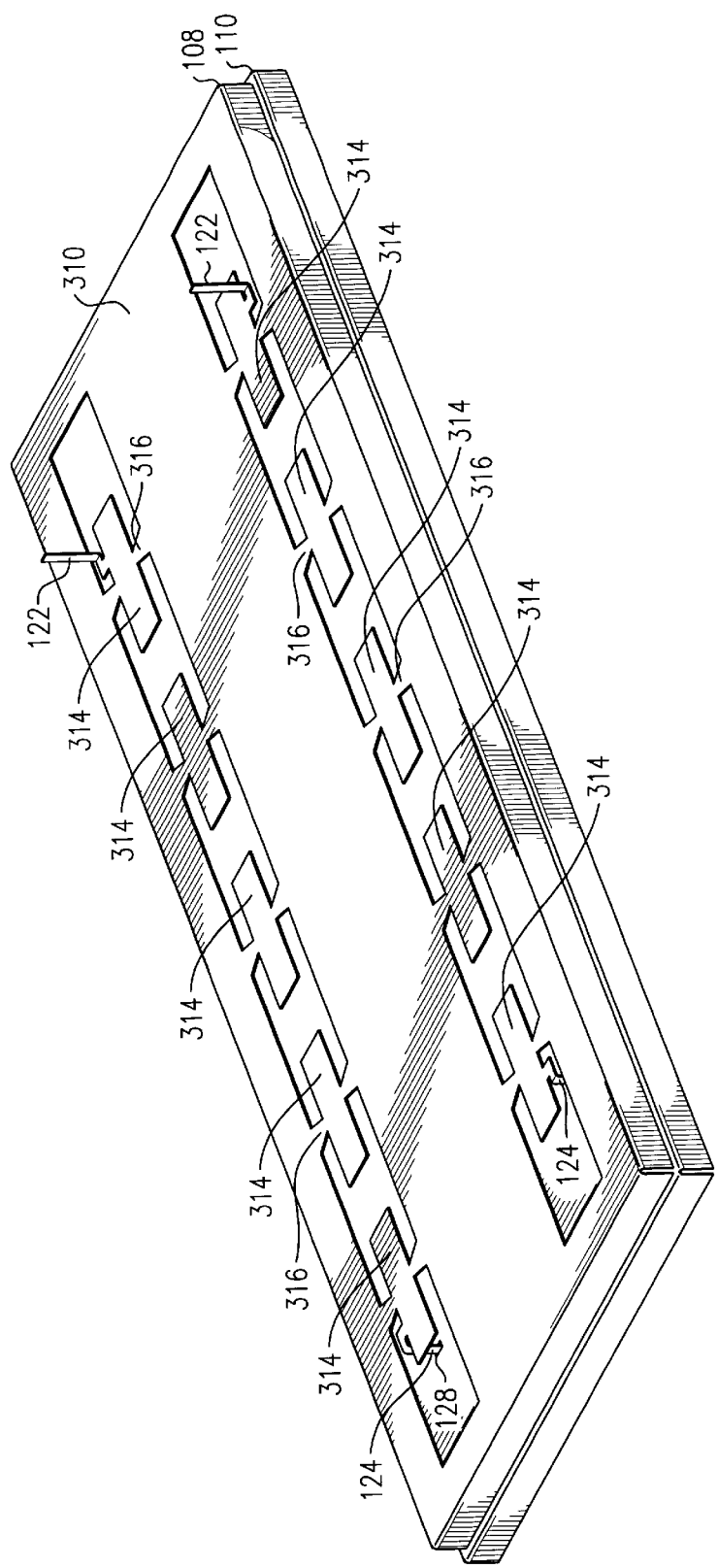
FIG. 3 is a perspective view of a filter layer of the transceiver stack assembly of FIG. 1.

FIG. 3 shows details of filter layer 108. Filter layer 108 comprises a frame 310 and a pair of resonator arrays inside of frame 310. Each resonator array forms a filter and comprises a plurality of resonators 314 each connected to frame 310 by a pair of supports 316. Outermost resonators 314 of each array on one end of filter layer 108 define flanges 122. Outermost resonators 314 of each array on the other end of filter layer 108 define flanges 124. Frame 310 and the resonator arrays including flanges 122 and 124. are preferably of unitary construction, stamped or otherwise produced from a single sheet of metal. Interconnects (flanges 122 and 124) to the filters are thus achieved during normal manufacturing of the filters at no additional cost. Filter layer 108 is illustratively the filter element disclosed in the application of R. Barnett et al. entitled "Sheet-Metal Filter", Ser. No. 09/666,192, filed on Sep. 21, 2000, with a priority date even herewith and assigned to the same assignee.

Frame 310 spaces the resonator arrays away from lower reflector layer 110. Frame 310 is welded, epoxied, soldered, or otherwise attached to lower reflector layer 110. Layers 106 and 110 and frame 310 together form an electromagnetically isolating enclosure for the filters that are formed by the resonator arrays of layer 108. This enclosure may also act as a heat sink for the transceiver circuitry of layer 112. Air inside the enclosure forms dielectric layers of the filters.

Figure 4:
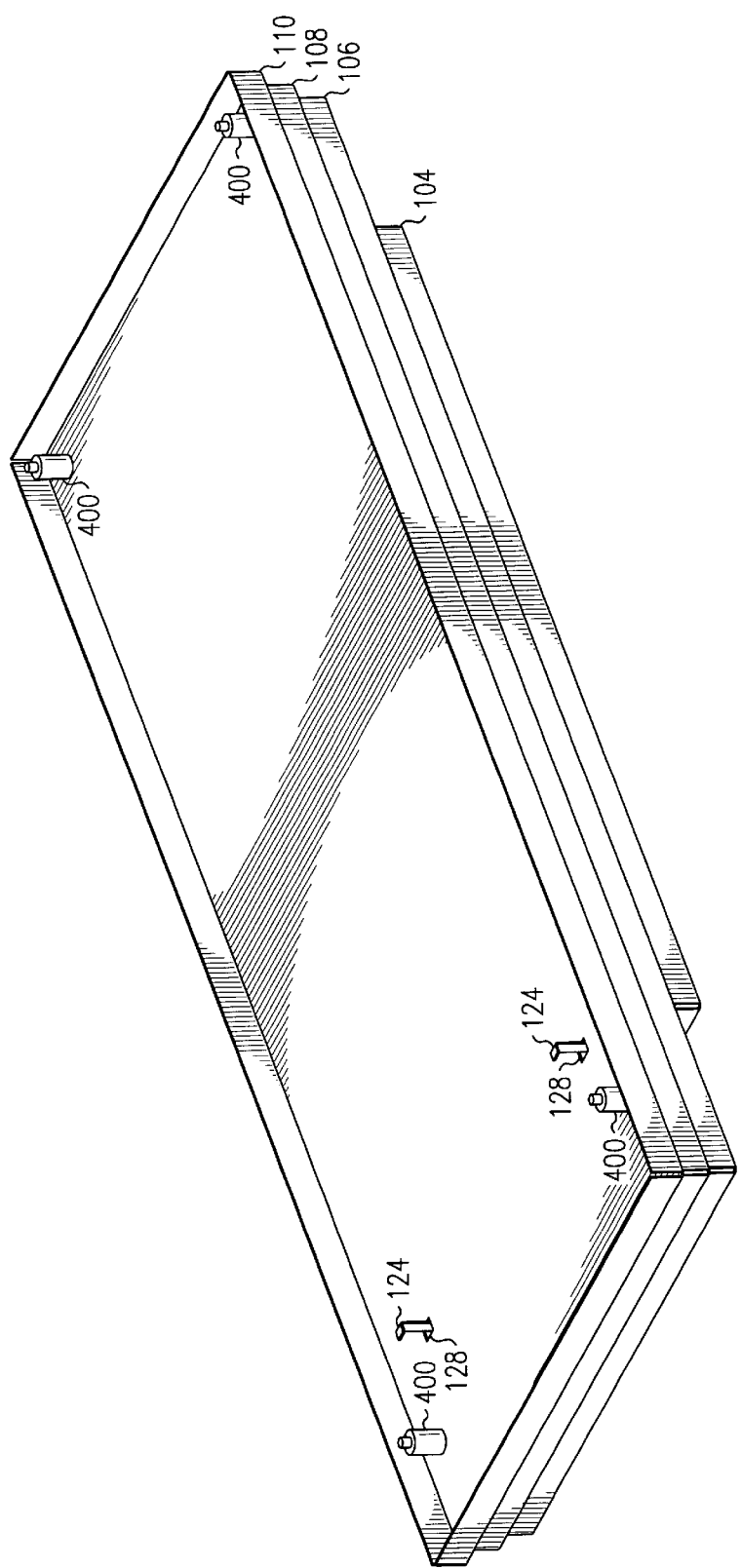
FIG. 4 is a bottom perspective view of the transceiver stack assembly of FIG. 1.

FIG. 4 shows details of the underside of lower reflector layer 110. Layer 110 is preferably merely a metal "pan" with orifices 128 for flanges 124 of filter layer 108. The underside of layer 110 has standoffs (spacers) 400 mounted thereto for mounting electronics layer 112 to layer 110. Flanges 124 of filter layer 108 which protrude through orifices 128 make either physical or capacitive contact with pads 138 (see FIG. 1) of electronics layer 112. Layer 110 also acts as an electromagnetic shield, and optionally as a heat sink, for electronics layer 112.

Figure 5:
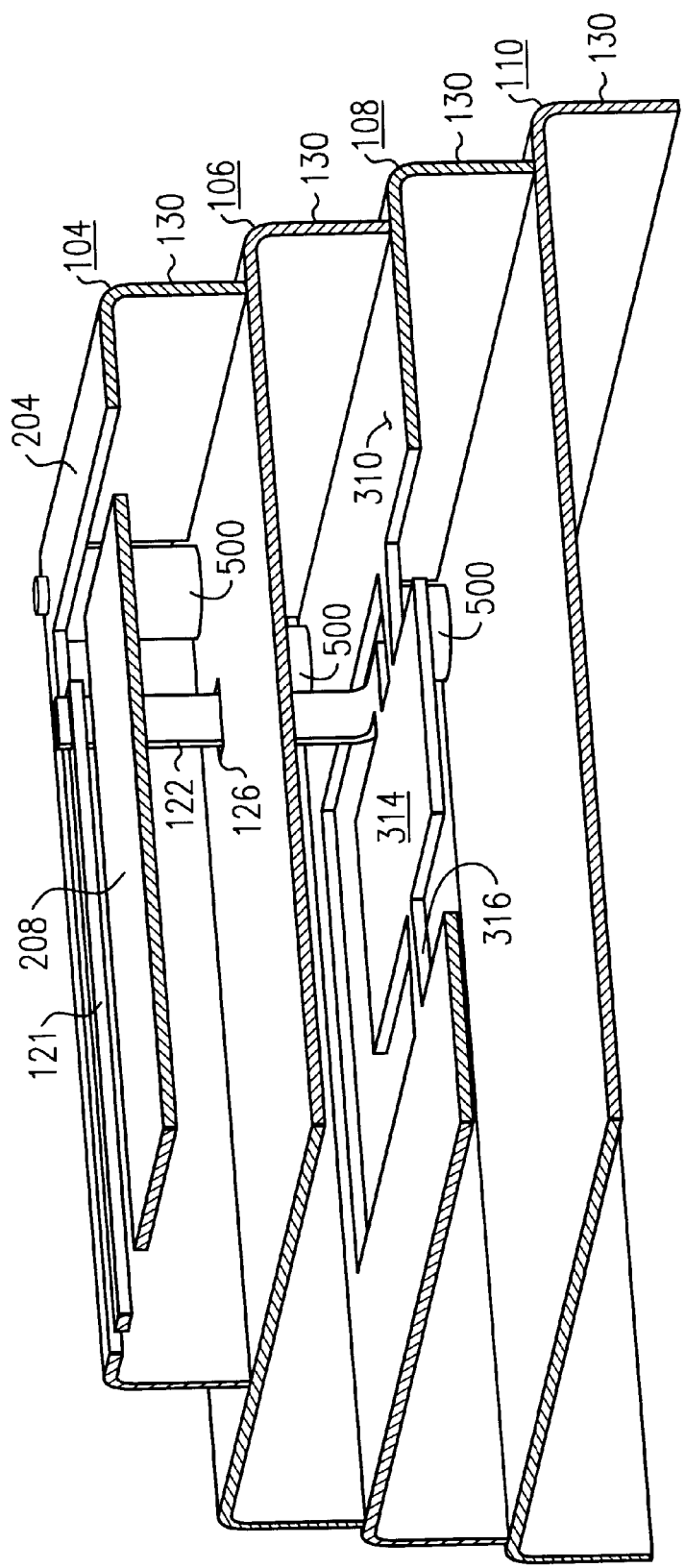
FIG. 5 is a cutaway side perspective view of the transceiver stack assembly of FIG. 1.

FIG. 5 presents a cutaway side perspective view of stack assembly 104–110 that shows in greater detail the intercoupling of layers 104 and 108 that is effected by a flange 122. The coupling structure can bridge fairly wide gaps, either conductively or radiatively. In the radiative coupling, a coupling capacitor (illustratively formed by the tips of flange 122 and combiner 121 which are positioned in proximity to, but do not touch, each other) forms a series inductive-capacitive resonant circuit (or a more-complex but still series resonance type of circuit) together with interconnecting flange 122 (bent up/down strip) and provides very low loss connection near the resonant frequency. This is described in more detail in the application of R. Barnett et al. entitled "Resonant Capacitive Coupler", Ser. No. 09/521,724 filed on even date herewith and assigned to the same assignee. The capacitor therefore provides not just coupling, but in fact compensates for the inductance of interconnecting flange 122. The capacitor in this design can be much smaller (in some cases by an order of magnitude) than a coupling capacitor that would be used conventionally to connect two 50Ω sections, and hence is much easier to implement. This type of connection can be applied to coaxial, two wire, and coplanar waveguide types of interconnecting structures. The capacitor itself may or may not have a dielectric, i.e., the dielectric may be air. The dielectric may be anything from a ceramic to a double-sided adhesive tape, which provides mechanical robustness.

FIG. 5 further shows optional spacers 500 that may be employed between layers 104–110 to. ensure proper spacing between the layers. Generally, one spacer 500 would be used in each one of the four corners of layers 104–108, similarly to how standoffs 400 are positioned on layer 110 in FIG. 4. Spacers 500 may be stamped or molded plastic standoffs, or other low-cost precision ,parts, such as ball bearings, or even electronic components used as spacers.

Of course, various changes and modifications to the illustrative embodiment described above will be apparent to those skilled in the art. For example, the layers may be aligned by use of projecting pins or tabs interlocking into adjacent layers. Proper spacing between layers may be achieved by use of a precision jig during assembly to hold distances correct during soldering or welding. The principles of the stack assembly are applicable to the construction of an antenna alone or a filter alone, or to. any other electronic assembly. The lower reflector layer 110 could also be used to provide extra mechanical rigidity for the circuit board of the electronics layer. Or, instead of all of the layers being pan-shaped and all facing in the same direction, some layers may be just flat sheets of conductive material sandwiched between adjacent pan-shaped layers that face each other across the interspaced flat layer. In this case, the assembly may also include adjacent pan-shaped layers that face away from each other and are attached to each other back-to-back (pan bottom-to-pan bottom). Such changes and modifications can be made without departing from the spirit and the scope of the invention and without diminishing its attendant advantages. It is therefore intended that such changes and modifications be covered by the following claims except insofar as limited by the prior art.

What is claimed is:

1. A stacked assembly comprising:
   a plurality of conductive planar portions, each defining a plane;
   a plurality of conductive wall portions, each defining a closed wall within a plane;
   the planar portions and the wall portions being positioned side-by-side with each other along an axis and with their planes being substantially perpendicular to the axis, the planar portions and the wall portions alternating with each other and being affixed to each other;
   at least some of the planar or wall portions having electrical components one of stamped, cut, and etched in said portions such that the electrical components are physically defined by the portions themselves, the electrical components all being interconnected with each other; and at least some of the planar and wall portions forming at least one electrically isolated chamber that encloses at least some of the electronic components.

2. The stacked assembly of claim 1 wherein:
the portions are affixed to each other by a non-conductive adhesive.

3. The stacked assembly of claim 1 wherein:
at least one planar portion and at least one. wall portion are made as a unit from a single sheet of conductive material.

4. A stacked assembly comprising:
a plurality of pan-shaped conductive units at least some of which have electrical components one of stamped, cut, and etched in said units such that the electrical components are physically defined by the units themselves, all facing in a same direction and stacked one on top of another and fixedly attached to each other so that adjacent said units define electrically isolated chambers, and the electrical components carried by different said units being electrically connected to each other.

5. The stacked assembly of claim 4 wherein:
at least one said unit comprises
a planar member defining substantially a flat surface that forms a bottom of the pan-shape, and
a closed wall member defining an edge and attached along the edge to the flat surface to form sides of the pan-shape.

6. The stacked assembly of claim 4 wherein:
at least one said unit comprises
a single unitary member shaped to form both a bottom and sides of the pan shape.

7. The stacked assembly of claim 6 wherein:
a portion of the unitary member that forms the bottom of the pan shape itself defines an electrical component.

8. The stacked assembly of claim 4 wherein:
the units are fused to each other by one of weld, solder, and mechanical fastening.

9. The stacked assembly of claim 4 wherein:
the mechanical fastening comprises a nonconductive adhesive.

10. The stacked assembly of claim 4 wherein:
a bottom of the pan-shape of one unit and sides of the pan shape of another unit of each pair of adjacent said units are fixedly attached to each other.

11. The stacked assembly of claim 4 wherein:
at least one said unit defines a lip along its periphery by means of which lip said unit is attached to an adjacent said unit.

12. The stacked assembly of claim 4 further comprising:
a plurality of spacers extending between a pair of adjacent said units to maintain a predefined separation distance between bottoms of the pan-shapes of the pair of adjacent units.

13. The stacked assembly of claim 4 wherein:
at least a first said unit further defines a flange extending away from said first unit to a second said unit to effect a circuit connection with the second unit.

14. The stacked assembly of claim 13 wherein:
the flange extends through an opening defined by a third said unit that is positioned between the first unit and the second unit.

15. A method of making a stacked assembly, comprising:
forming electrical components in at least some of a plurality of conductive planar portions that each define a plane and a plurality of conductive wall portions that each define a closed wall within a plane by one of stamping, cutting, and etching the at least some of the planar or wall portions such that the electrical components are physically defined by the portions themselves;
arranging the planar and wall portions side-by-side with each other along an axis with their planes being substantially perpendicular to the axis and the planar portions and the wall portions alternating with each other; and
affixing the planar and wall portions to each other so that all of the electrical components are interconnected with each other and at least some of the planar and wall portions form at least one electrically isolated chamber that encloses at least some of the electronic components.

16. The method of claim 15 further comprising:
initially making at least one planar portion and at least one wall portion as a unit from a single sheet of conductive material.

17. The method of claim 15 wherein:
affixing comprises
adhering the portions to each other by a non-conductive adhesive.

18. A method of making a stacked assembly comprising:
forming electrical components in at least some of a plurality of pan-shaped conductive units themselves by one of stamping, cutting, and etching the units such that the electrical components are physically defined by the units themselves;
stacking the units one on top of each other such that the units all face in a same direction;
attaching the units to each other so that adjacent said units define electromagnetically isolated chambers and the electrical components carried by different said units are electrically connected to each other.

19. The method of claim 18 further comprising:
initially making the plurality of pan-shaped conductive units.

20. The method of claim 19 wherein:
initially making comprises
attaching a closed wall member that forms sides of the pan shape and defines an edge along the edge to a planar member that defines a substantially flat surface that forms a bottom of the pan shape to make one said unit.

21. The method of claim 19 wherein:
initially making comprises
shaping a single unitary member to define both a bottom and sides of the pan shape of one said unit.

22. The method of claim 21 wherein:
defining comprises
defining an electrical component in the portion of the unitary member itself that forms the bottom of the pan shape.

23. The method of claim 19 wherein:
initially making comprises
forming a flange in at least a first said unit extending away from said first unit, and
stacking comprises
forming a circuit connection between the first unit and a second unit by means of the flange extending from the first unit to the second unit.

24. The method of claim 23 wherein:

initially making further comprises
  defining an opening in a third said unit; and stacking comprises
  stacking the third unit between the first unit and the second unit, and
  extending the flange through the opening.

25. The method of claim 18 wherein:

attaching comprises
  fusing the units to each other by one of welding, soldering, and mechanically fastening.

26. The method of claim 25 wherein:

mechanically fastening comprises
  adhering with nonconductive adhesive.

27. The method of claim 18 wherein:

attaching comprises
  fixedly attaching to each other a bottom of the pan-shape of one unit and sides of the pan-shape of another unit of each pair of adjacent said units.

28. The method of claim 18 wherein:

attaching comprises
  attaching adjacent said units to each other by means of a lip defined along a periphery of one of said adjacent units.

29. The method of claim 18 wherein:

stacking comprises
  placing a plurality of spacers between a pair of adjacent said units to maintain a predefined separation distance between bottoms of the pan-shapes of the pair of adjacent units.

* * * * *